United States Patent [19]

Reifel et al.

[11] Patent Number: 4,931,906

[45] Date of Patent: Jun. 5, 1990

[54] HERMETICALLY SEALED, SURFACE MOUNTABLE COMPONENT AND CARRIER FOR SEMICONDUCTOR DEVICES

[75] Inventors: Harry C. Reifel, Topsfield; Eren Erdag, Somerville; Herman V. D. Soerewyn, Peabody, all of Mass.

[73] Assignee: Unitrode Corporation, Lexington, Mass.

[21] Appl. No.: 173,370

[22] Filed: Mar. 25, 1988

[51] Int. Cl.$^5$ .............................................. H05K 7/20
[52] U.S. Cl. .................................... 361/386; 357/74; 357/81; 361/401; 361/414
[58] Field of Search .......................... 174/16.3, 52 FP; 357/74, 80, 81; 361/386–389, 400, 401, 414; 165/80.3, 185

[56] References Cited

U.S. PATENT DOCUMENTS

| | | | |
|---|---|---|---|
| 3,777,220 | 12/1973 | Tatusko et al. | 361/386 |
| 3,959,874 | 6/1976 | Coucoulas | 29/577 |
| 3,961,415 | 6/1976 | Davis, Jr. | 29/591 |
| 4,162,514 | 6/1979 | De Bruyne et al. | 361/2 |
| 4,246,596 | 1/1981 | Iwasaki | 357/79 |
| 4,250,482 | 2/1981 | Kouchich et al. | 338/275 |
| 4,355,463 | 10/1982 | Burns | 29/827 |
| 4,474,292 | 10/1984 | Haghiri-Tehrani et al. | 206/329 |
| 4,538,170 | 8/1985 | Yerman | 357/80 |
| 4,581,479 | 4/1986 | Moore et al. | 174/52 |
| 4,594,644 | 6/1986 | Painter | 361/417 |
| 4,595,096 | 6/1986 | Sinnadurai et al. | 206/331 |
| 4,630,172 | 12/1986 | Stenerson et al. | 361/386 |
| 4,677,741 | 7/1987 | Takahama | 29/588 |
| 4,692,789 | 9/1987 | Nakamura | 357/74 |
| 4,729,061 | 3/1988 | Brown | 361/386 |
| 4,731,701 | 3/1988 | Kuo et al. | 361/388 |
| 4,750,089 | 6/1988 | Derryberry et al. | 361/386 |
| 4,812,792 | 3/1989 | Leibowitz | 361/414 |

Primary Examiner—Gregory D. Thompson
Attorney, Agent, or Firm—Weingarten, Schurgin, Gagnebin & Hayes

[57] ABSTRACT

A hermetically sealed, surface mount chip carrier for a semiconductor device is disclosed. The chip carrier is formed of a plurality of layers of conductive material and insulating material. A cavity adapted to receive the semiconductor device is provided within the layers. The device is electrically connected to the conductive layers via electrical conductors bonded to exposed surfaces or shelves on selected ones of the conductive layers. The layers have a continuous periphery to eliminate gaps or vertical discontiniuties in the chip carrier. The conductive and insulating layers have similar coefficients of thermal expansion to provide unitary expansion and contraction of the entire carrier so as to maintain a hermetic seal in the chip carrier when subjected to thermal stresses.

25 Claims, 13 Drawing Sheets

HERMETICALLY SEALED, SURFACE MOUNTABLE COMPONENT AND CARRIER FOR SEMICONDUCTOR DEVICES

FIELD OF THE INVENTION

This invention relates generally to packages for carrying semiconductor devices and more specifically to chip carriers adapted for surface mounting.

BACKGROUND OF THE INVENTION

Surface-mount packages or chip carriers are useful to achieve high density circuits and may be easily manufactured with automated high volume manufacturing techniques. An example of such a chip carrier is shown in U.S. Pat. No. 4,595,096 to Sinnadurai, et al. Nakamura, et al., U.S. Pat. No. 4,692,789, discloses a package for high power semiconductor chips comprising a ceramic case and conductor lead plates. Davis Jr., U.S. Pat. No. 3,961,415, shows a chip carrier with ribbon leads attaching the chip to the carrier. Yerman, U.S. Pat. No. 4,538,170, discloses a high power chip package for removing heat from chips undergoing testing. Certain chip carriers exhibit hermetic sealing of the chip carrier for protection of the chip. Burns, U.S. Pat. No. 4,355,463, discloses a process for hermetically sealing semiconductor devices. The package shown by Yerman may be hermetically sealed.

The prior art, however, does not disclose a carrier which provides a high conductivity path through a hermetic seal which is capable of handling high currents and which can withstand the high thermal stresses associated with device construction and the longer term "IR" thermal stresses during the life of the component. Consequently, surface-mount chip carriers have generally not been employed in high power applications or applications in which a hermetically sealed surface-mount chip carrier was desirable.

SUMMARY OF THE INVENTION

In accordance with the present invention, a hermetically sealed chip carrier adapted for surface mounting is disclosed. The chip carrier is formed from a number of layers of a sheet conductor which are separated by layers of an electrically insulating material having a coefficient of thermal expansion similar to that of the sheet conductor.

Selected ones of the sheet conductors and insulating layers, prior to assembly, have a hole provided in the layer, so that upon assembly, a cavity is created in the center portion of the carrier. The sheet conductors and ceramic insulators have a continuous periphery, with no vertical discontinuities or interfaces as commonly found in prior art chip carriers. Selected ones of the sheet conductors have tabs extending therefrom which may be deformed downward toward the intended contact surface for interconnection in a circuit. The size of the chip carrier and the tabs and, more specifically, the cross sectional area of the tab extending from the package, may be sized to accommodate currents of 50 amps and beyond. The current carrying capability of a particular device is determined by the size of the device, the heat sinking capability of the package, and the cross sectional area of the respective tabs.

As a consequence of the matched thermal coefficient of expansion between the sheet conductors and the ceramic insulators and the continuous periphery around the carrier cavity, the chip carrier expands and contracts uniformly as a unit thus minimizing stresses on the interfaces where the respective layers are joined. Thus a carrier may be constructed and a hermetic seal may be created and maintained at respective layer interfaces even when the carrier is subjected to brazing induced thermal stresses during package construction, stresses resulting from semiconductor device mounting such as resulting from a soldering or gold-silicon eutectic mounting process and when the carrier is subjected to the high currents employed with such a carrier.

BRIEF DESCRIPTION OF THE DRAWINGS

These and other features of the invention are more fully set forth in the solely exemplary detailed description and the accompanying drawings of which.

DETAILED DESCRIPTION OF THE INVENTION

Figure 1:
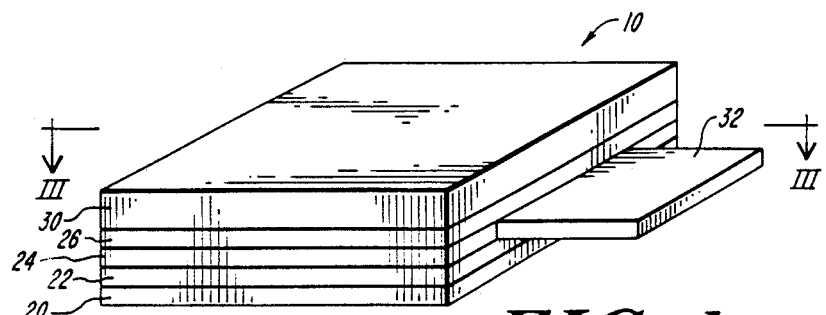
FIG. 1 is a perspective view of a two terminal chip carrier in accordance with the present invention.

FIG. 1 shows a two terminal chip carrier 10 of the present invention. The carrier is formed from a plurality of conductive layers of sheet conductors 20, 24 and an insulating layer 22, such as a ceramic layer. A layer 26 is employed to space the layer 24 from a lid 30. The layer 26 may be either a conductive or insulating layer as appropriate. The lid 30 is the topmost layer. The lid may be either an insulator or a conductive material such as Kovar TM. Carrier 10 is intended for mounting to a circuit board so that the lower surface of conductive layer 20 lies against and contacts the board. Conductive layer 24 includes a tab 32 which extends beyond the adjacent insulating layers 22, 24. Tab 32 may be bent down to contact a circuit board.

Figure 2:
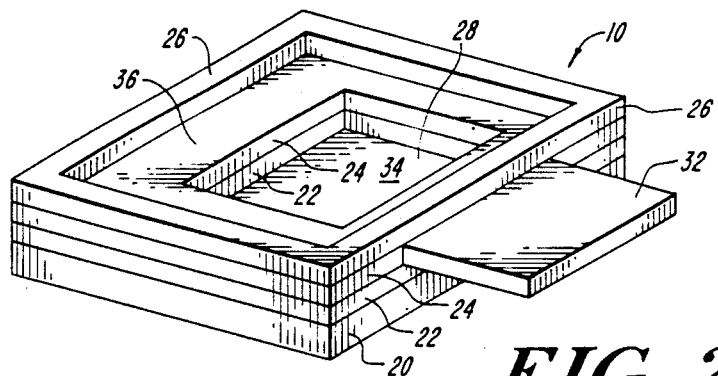
FIG. 2 is a perspective view of the chip carrier of FIG. 1 with the lid removed.
Figure 3:
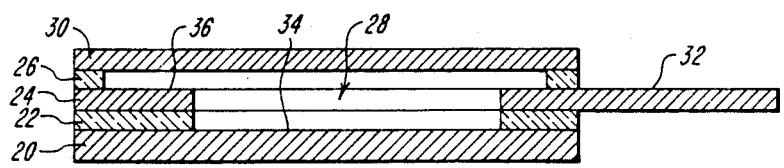
FIG. 3 is a cross-sectional view of the chip carrier of FIG. 1 along line III—III.
Figure 16:
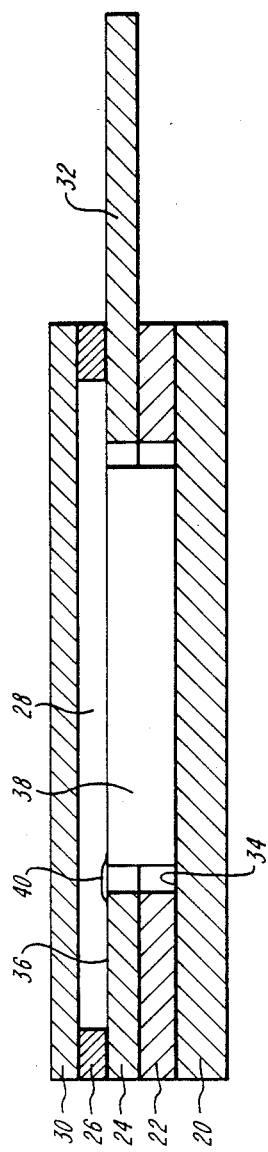
FIG. 16 is a cross-sectional view of the chip carrier of FIG. 1 with a power semiconductor device.

Cavity 28, shown in FIGS. 2 and 3, is formed from holes cut through layers 22, 24, and 26. As shown in FIG. 16, one or more semiconductor devices 38 such as a diode, rectifier, darlington, power transistor, or any other power device or integrated circuit may be mounted within cavity 28 and may be connected to the upper surface 34 of conductive layer 28 so that surface 34 forms the bottom of cavity 28. The hole through layer 26 is larger than the holes through layers 22 and 24. This larger hole exposes the surface of conductive layer 24, forming a shelf 36 of conductive material. A lead 40 from the chip is attached to the shelf 36, by any method well known in the art, to electrically connect the chip to the conductive layer 24. Lid 30 is placed over layer 26 to seal the chip within the cavity 28.

Figure 4:
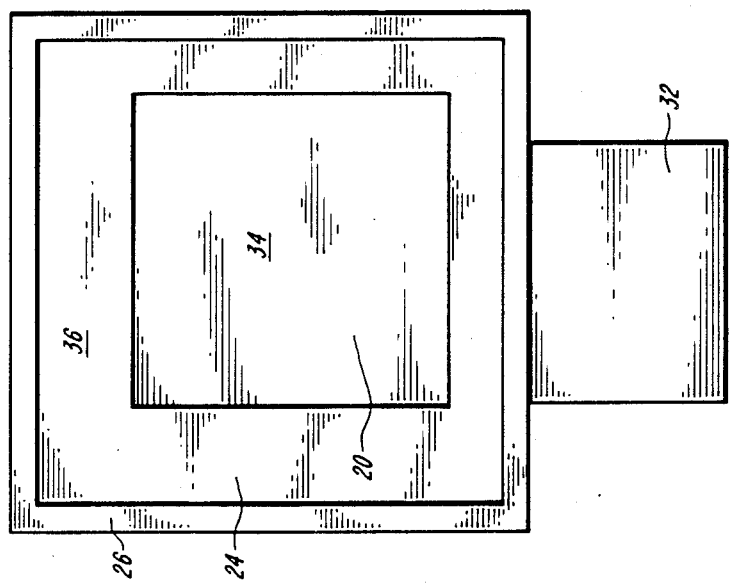
FIG. 4 is a top view of the chip carrier of FIG. 1 with the lid removed.

FIG. 4 shows a top view of carrier 10 with lid 30 removed. The holes through layers 22 and 24 need not be centered in the layer and may be offset.

Figure 5:
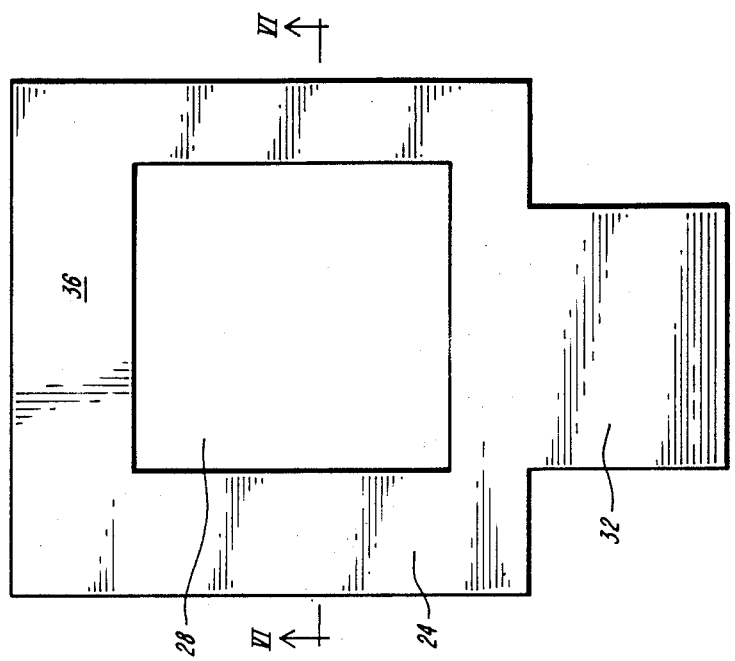
FIG. 5 is a top view of a component of the carrier of FIG. 1.
Figure 6:
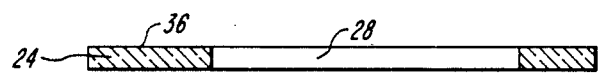
FIG. 6 is a cross-sectional view of the component of FIG. 5 along line VI—VI.
Figure 7:
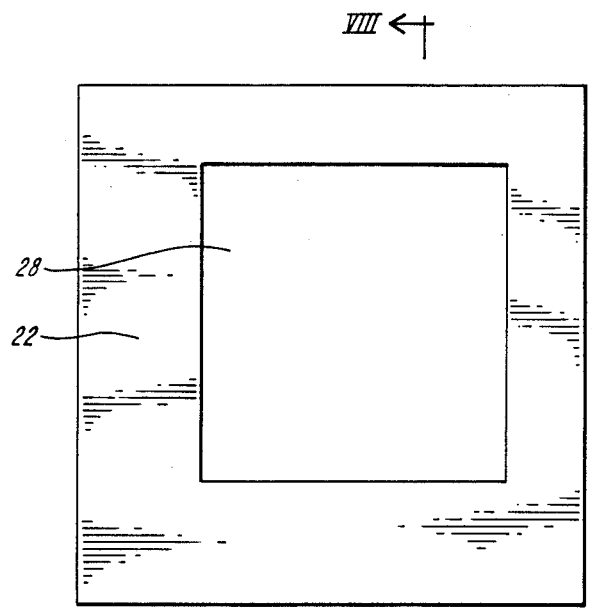
FIG. 7 is a top view of another component of the carrier of FIG. 1.
Figure 8:
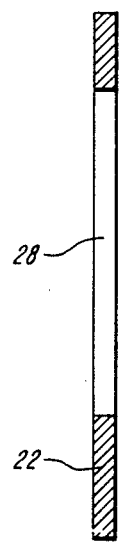
FIG. 8 is a cross-sectional view of the component of FIG. 7 along line VIII—VIII.

FIGS. 5 and 6 show conductive layer 24 isolated from carrier 10. Similarly, FIGS. 7 and 8 show insulating layer 22 isolated from carrier 10. Preferably the holes through layers 22 and 24 are of the same size and are aligned when carrier 10 is assembled. Further, the layers are each formed from one piece of material, so that no vertical discontinuities are present when carrier 10 is assembled. This insures a continuous periphery surrounding the chip.

The chip is preferably hermetically sealed within carrier 10 by sealing the layers and lid of carrier 10 together. Layers 22, 24 and 26 may be joined together by brazing or any method known in the art. Lid 30 may be attached by any known method.

The layers in the carrier of the present invention are able to expand and contract in response to thermal stresses in a unitary manner, with no significant differential expansions and contractions between the insulating and the conductive layers. Such unitary expansion and contraction allows carrier 10 to maintain a hermetic seal. The aforementioned unitary thermal expansion is provided by fabricating the insulating layers and conductive layers from materials with similar or matched coefficients of thermal expansions. A suitable insulating material is a ceramic such as alumina. A suitable conductive material is a composite material formed from a lamination of copper and molybdenum. In addition, the layers are formed with a continuous periphery having no vertical discontinuities. This feature further ensures a unitary rather than differential thermal expansion and contraction.

Figure 9:
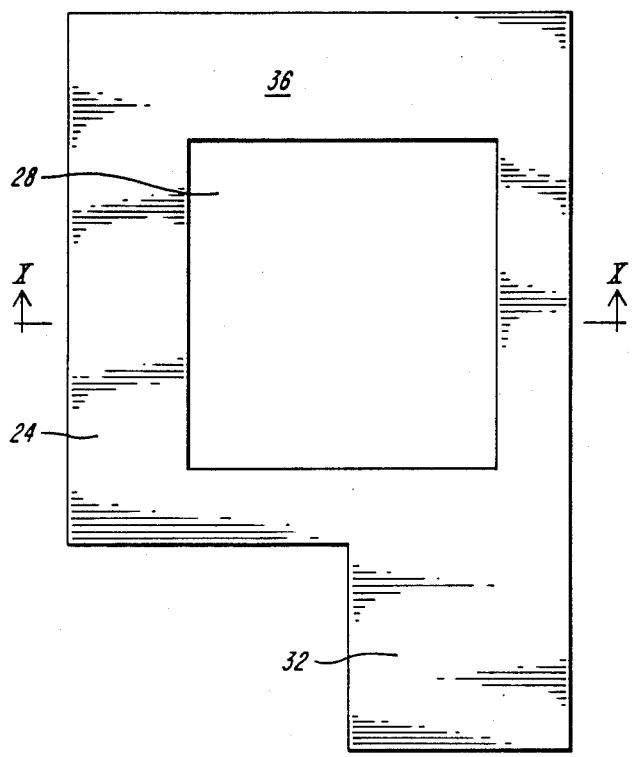
FIG. 9 is a top view of an alternative embodiment of the component of FIG. 5.
Figure 10:
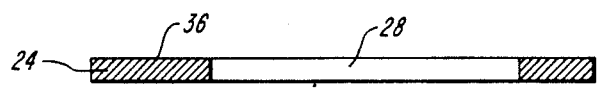
FIG. 10 is a cross-sectional view of the component of FIG. 9 along line X—X.

FIGS. 9 and 10 show an alternative embodiment of carrier 10 of FIG. 1 in which conductive tab 32 of conductive layer 24 is offset to one side allows inversion and reversal of the conductive layer to provide multiple tabs on one side of the carrier.

Figure 11:
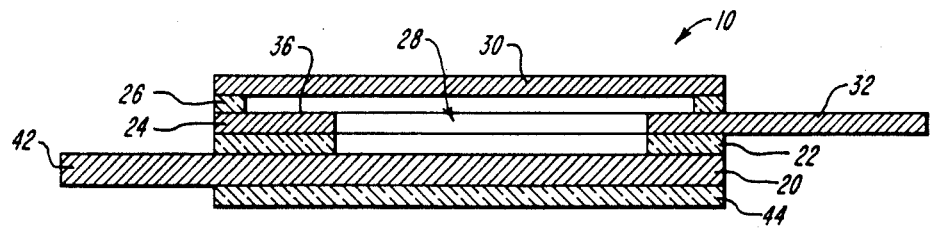
FIG. 11 is a cross-sectional view of an alternative embodiment of the two terminal chip carrier in accordance with the present invention.

FIG. 11 shows an alternative embodiment of the two terminal chip carrier in which the lowest conductive layer 20 includes a conductive tab 42 extending beyond the insulating layer 22. A further insulating layer 44 is placed beneath conductive layer 20. Tab 36 may be bent down to connect to a conductive portion on the circuit board. This embodiment is particularly suitable for attaching to a heat sink when electrical isolation is necessary.

Figure 12:
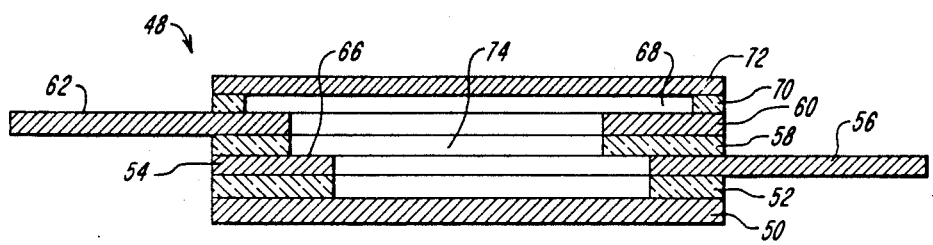
FIG. 12 is a cross-sectional view of a three-terminal chip carrier in accordance with the present invention.

A three terminal chip carrier 38 is shown in FIG. 12. In this embodiment, conductive layers 50, 54, and 60 are alternately disposed between the insulating layers 52, 58 and 70. Lid 72, may be formed of a material such as Kovar ™, and is placed on top of layer 70 to seal the cavity 74. Conductive layer 54 has a conductive tab 56 integral with and extending beyond the carrier, and conductive layer 60 likewise has a tab 62 extending beyond the carrier. These tabs may be bent down to contact a circuit board. Tabs 56 and 62 are shown extending from opposite sides to carrier 48. Alternatively, the tabs may extend from adjacent sides. Holes are formed through layers 52, 54, 58, 60 and 70, forming cavity 74 for carrying a semiconductor device. The hole in insulating layer 58 is cut to expose the upper surface of conductive layer 54, forming shelf 66 to which a lead from the chip may be connected. Similarly, the hole through layer 70 is cut to expose the upper surface of conductive layer 60, forming shelf 68 to which a lead from the chip may be connected.

Figure 13:
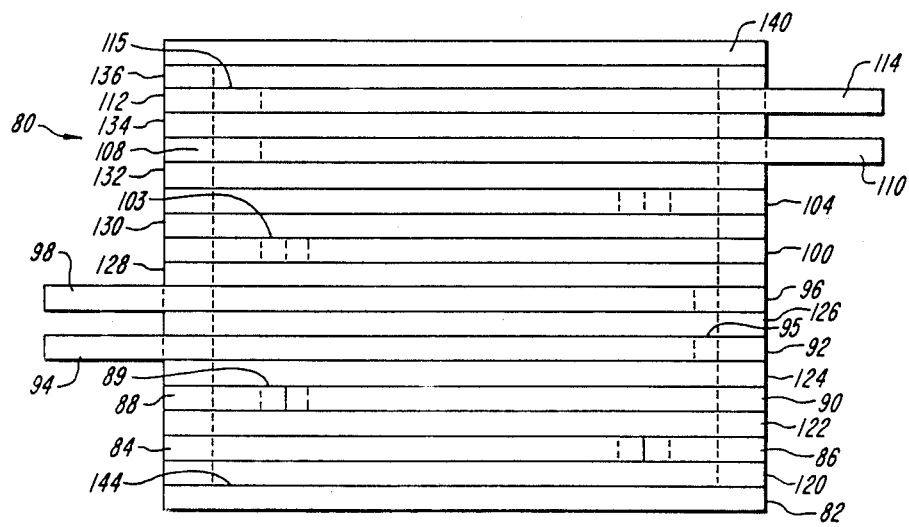
FIG. 13 is a side view of a multi-terminal chip carrier in accordance with the present invention.
Figure 14:
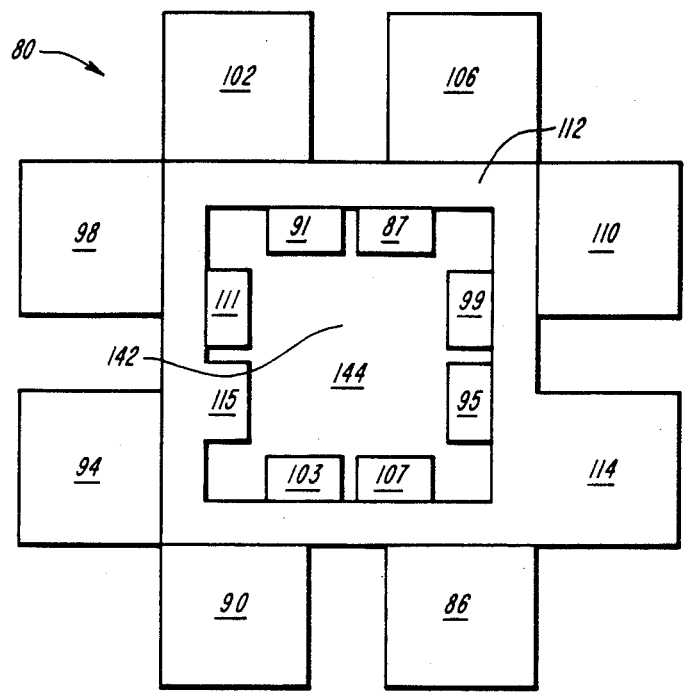
FIG. 14 is a top view of the chip carrier of FIG. 13 with the lid removed.
Figure 15:
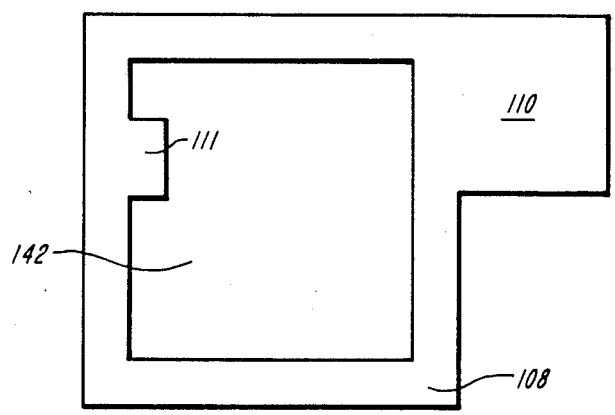
FIG. 15 is a top view of a component of the carrier of FIG. 13.

The present invention is not limited in the number of terminals which it may include FIGS. 13 and 14 show an embodiment of a carrier 80 having eight terminals in addition to a conductive bottom layer. The carrier comprises a stack of conductive layers 82, 84, 88, 92, 96, 100, 104, 108 and 112. Conductive layer 82 forms the bottom surface 144 of cavity of 142. Each conductive layer is separated by insulating layers 120, 122, 124, 126, 128, 130, 132, and 134. A seal layer 136 may be formed of an insulating or conductive material as appropriate. Lid 140 is employed to seal the cavity. With the exception of bottom conductive layer 82 each conductive layer includes a conductive tab 86, 90, 94, 98, 102, 106, 110 and 114, extending from the carrier 80. The tabs are best seen in FIG. 14, a top view of carrier 80 with a lid 14 removed. Each conductive layer, with the exception of layer 82, also includes a tab extending into cavity 144 to form a shelf 87, 91, 95, 99, 103, 107, 111, and 115 for providing an area for connecting leads from a semiconductor device disposed in the cavity. The shelves are also best seen in FIG. 14. FIG. 15 shows single conductive layer 108 isolated from carrier 80. Each conductive layer is similarly formed with its tab shelf appropriately positioned in the carrier.

One or more semiconductor devices may be disposed within the disclosed carrier.

The above described invention is illustrative of a novel surface-mount chip carrier adapted to receive a high power semiconductor device and a high power semiconductor device in combination with said novel surface-mount chip carrier. Other modifications, embodiments and departures from the present disclosure are possible without departing from the inventive concept contained herein. Consequently, the invention is to be viewed as embracing each and every novel feature and novel combination of features present in or possessed by with the apparatus herein disclosed and is limited solely by the scope and spirit of the appended claims.

What is claimed is:

1. A surface mountable chip carrier adapted to receive at least one semiconductor device comprising:
   a plurality of unitary conductive layers each comprising a sheet conductor having a predetermined thickness, a continuous periphery and a first coefficient of thermal expansion;
   a plurality of unitary insulating layers each having a predetermined thickness and a continuous periphery and a coefficient of thermal expansion substantially equal to said first coefficient of thermal expansion;
   said conductive and insulating layers being joined together to form a unitary body with at least one insulating layer interposed between adjacent conductive layers; said unitary body having a top layer and a bottom layer; and at least some of said conductive and insulating layers having a hole through the respective layers so as to form a cavity within said body adapted to receive said at least one semiconductor device.

2. The surface mountable chip carrier of claim 1 wherein said bottom layer of said unitary body comprises a conductive layer adapted for electrical interconnection with said semiconductor device.

3. The surface mountable chip carrier of claim 1 wherein at least one of said conductive layers includes an integral tab unitary with said conductive layer and extending outward from the unitary body and adapted for electrical connection to an electronic circuit.

4. The surface mountable chip carrier of claim 1 wherein said top layers forms the top of said cavity.

5. The surface mountable chip carrier of claim 4 wherein said top layer is a layer of Kovar.

6. The surface mountable chip carrier of claim 1 wherein at least one of said insulating layers is ceramic.

7. The surface mountable chip carrier of claim 1 wherein at least one of said insulating layers is alumina.

8. The surface mountable chip carrier of claim 1 wherein said bottom layer is an insulating layer.

9. The surface mountable chip carrier of claim 1 wherein at least one of said conductive layers comprises a laminate of copper and molybdenum.

10. The surface mountable chip carrier of claim 1 wherein said hole in at least one of said insulating layers is sized to expose a planar surface on an adjacent conductive layer so as to form a shelf adapted for electrical interconnection with said semiconductor device.

11. The surface mountable chip carrier of claim 1, wherein said cavity is hermetically sealed.

12. The surface mountable chip carrier of claim 1 wherein said semiconductor device is a high power device.

13. A high power component comprising:
a power semiconductor device having at least two electrical contacts;
a plurality of unitary conductive layers each comprising a sheet conductor having a predetermined thickness, a continuous periphery and a first coefficient of thermal expansion;
a plurality of unitary insulating layers each having a predetermined thickness, a continuous periphery and a coefficient of thermal expansion substantially equal to said first coefficient of thermal expansion;
said conductive and insulating layers being joined together to form a unitary body with at least one insulating layer interposed between adjacent conductive layers; said unitary body having a top layer and a bottom layer;
at least some of said conductive and insulating layers having a hole through the respective layers so as to form a cavity within said body adapted to receive said power semiconductor device;
said semiconductor device being disposed within said cavity;
each of said semiconductor device electrical contacts being electrically interconnected to one of said conductive layers.

14. The high power component of claim 13 wherein said bottom layer of said unitary body comprises a conductive layer adapted for electrical interconnection with said high power semiconductor device.

15. The high power component of claim 13 wherein at least one of said conductive layers includes an integral tab unitary with said conductive layer and extending outward from the unitary body and adapted for electrical connection to an electronic circuit.

16. The high power component of claim 13 wherein said top layer forms the top of said cavity.

17. The high power component of claim 16 wherein said top layer is an insulating layer of Kovar.

18. The high power component of claim 13 wherein at least one of said insulating layers is ceramic.

19. The high power component of claim 13 wherein at least one of said insulating layers is alumina.

20. The high power component of claim 13 wherein said bottom layer is an insulating layer.

21. The high power component of claim 13 wherein at least one of said conductive layers comprises a laminate of copper and molybdenum.

22. The high power component of claim 13 wherein said hole in at least one of said insulating layers is sized to expose a planar surface on an adjacent conductive layer so as to form a shelf adapted for electrical interconnection with said semiconductor device.

23. The high power component of claim 13 wherein said semiconductor device is a diode.

24. The high power component of claim 13 wherein said semiconductor device is a power transistor.

25. The high power component of claim 13 wherein said cavity is hermetically sealed.

* * * * *

UNITED STATES PATENT AND TRADEMARK OFFICE
CERTIFICATE OF CORRECTION

PATENT NO. : 4,931,906

DATED : June 5, 1990

INVENTOR(S) : Harry C. Reifel, et al.

It is certified that error appears in the above-identified patent and that said Letters Patent is hereby corrected as shown below:

In Column 2, line 61, "Kovar TM" should read --Kovar (TM)--.

In Column 3, line 5, "of conductive layer 28" should read --of conductive layer 20--.

In Column 3, line 66, "Kovar TM" should read --Kovar (TM).

Signed and Sealed this

Seventh Day of July, 1992

Attest:

DOUGLAS B. COMER

*Attesting Officer*  *Acting Commissioner of Patents and Trademarks*